(12) United States Patent
Sasaki

(10) Patent No.: US 11,315,850 B2
(45) Date of Patent: Apr. 26, 2022

(54) SEMICONDUCTOR DEVICE

(71) Applicant: SHINDENGEN ELECTRIC MANUFACTURING CO., LTD., Chiyoda-ku (JP)

(72) Inventor: Mitsumasa Sasaki, Saitama-ken (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 574 days.

(21) Appl. No.: 16/085,921

(22) PCT Filed: Aug. 24, 2017

(86) PCT No.: PCT/JP2017/030280
§ 371 (c)(1),
(2) Date: Sep. 17, 2018

(87) PCT Pub. No.: WO2019/038876
PCT Pub. Date: Feb. 28, 2019

(65) Prior Publication Data
US 2020/0381327 A1 Dec. 3, 2020

(51) Int. Cl.
*H01L 23/367* (2006.01)
*H01L 23/31* (2006.01)
*H01L 23/498* (2006.01)

(52) U.S. Cl.
CPC ........ *H01L 23/367* (2013.01); *H01L 23/3107* (2013.01); *H01L 23/3121* (2013.01); *H01L 23/49861* (2013.01)

(58) Field of Classification Search
CPC ............... H01L 23/367; H01L 23/3107; H01L 23/49861; H01L 23/3121; H01L 23/49568;

(Continued)

(56) References Cited

U.S. PATENT DOCUMENTS 8,017,446 B2 * 9/2011 Eisele ............... H01L 23/49568
438/123
8,154,118 B2 * 4/2012 Kanazawa ............ H01L 23/645
257/724

(Continued)

FOREIGN PATENT DOCUMENTS

JP 2006-294729 A 10/2005
JP 2006-32617 A 2/2006

(Continued)

OTHER PUBLICATIONS

Translation of the International Preliminary Report on Patentability dated Feb. 27, 2020, in PCT/JP2017/030280, 6 pages.

(Continued)

*Primary Examiner* — Julio J Maldonado
*Assistant Examiner* — Abbigale A Boyle
(74) *Attorney, Agent, or Firm* — Oblon, McClelland, Maier & Neustadt, L.L.P.

(57) ABSTRACT

A semiconductor device according to an embodiment is attached to a radiator and includes a heat-generating electronic component, a sealing part sealing the electronic component, a lead member that includes an inner lead part sealed with the sealing part and an outer lead part exposed from the sealing part, and a lead member that includes an inner lead part sealed with the sealing part and an outer lead part exposed from the sealing part. The inner lead part has a heat-dissipating end part that releases heat propagating from the outer lead part to the radiator and an electrical connecting part that is positioned between the heat-dissipating end part and the outer lead part and is electrically connected to the main electrode of the electronic component.

6 Claims, 12 Drawing Sheets

(58) Field of Classification Search
CPC ......... H01L 23/49848; H01L 23/49555; H01L 23/49551
See application file for complete search history.

(56) References Cited

U.S. PATENT DOCUMENTS

| | | | | |
|---|---|---|---|---|
| 8,471,373 | B2* | 6/2013 | Minamio | H01L 23/49575 |
| | | | | 257/676 |
| 9,704,828 | B2* | 7/2017 | Ikeda | H01L 24/37 |
| 2010/0277873 | A1 | 11/2010 | Eisele et al. | |
| 2011/0255246 | A1 | 10/2011 | Eisele et al. | |
| 2013/0161801 | A1* | 6/2013 | Otremba | H01L 23/3735 |
| | | | | 257/668 |
| 2015/0179552 | A1 | 6/2015 | Myung et al. | |
| 2015/0179556 | A1 | 6/2015 | Song | |
| 2016/0099224 | A1 | 4/2016 | Yoshimatsu et al. | |

FOREIGN PATENT DOCUMENTS

| | | |
|---|---|---|
| JP | 2011-243752 A | 1/2011 |
| JP | 2016-72575 A | 5/2016 |

OTHER PUBLICATIONS

International Search Report dated Oct. 24, 2017 in PCT/JP2017/030280 filed Aug. 24, 2017, with a Translation of Category of Cited Documents in attached foreign language Search Report.

* cited by examiner

SEMICONDUCTOR DEVICE

TECHNICAL FIELD

The present invention relates to a semiconductor device, and more specifically to a semiconductor device attached to a radiator.

BACKGROUND ART

A semiconductor device configured by mounting a heat-generating electronic component and a lead member on an insulating substrate, such as a ceramic substrate, and thereafter sealing with resin is known. Examples of the heat-generating electronic component include semiconductor switching elements and diodes. Such a semiconductor device is attached to a radiator such as a heat sink and a vehicle body via a back surface of an insulating substrate, and heat generated in a heat-generating electronic component is dissipated to the radiator through the insulating substrate. An outer lead of a lead member is connected to an external device such as a battery via a busbar.

Note that Patent Literature 1 discloses a semiconductor device in which a conductive part is joined to a ceramic substrate, and in this semiconductor device, an Al wire and a lead member are connected to the conductive part.

CITATION LIST

Patent Literature

Patent Literature 1: Japan Patent Laid-Open No. 2006-32617

SUMMARY OF INVENTION

Technical Problem

Incidentally, heat generated in the external device connected to the aforementioned semiconductor device may propagate inside the semiconductor device through the lead member. In this case, the temperature of the heat-generating electronic component becomes high, which may cause a malfunction of the semiconductor device. In Patent Literature 1, the lead member is connected to a land part (conductive part), and thus, the heat propagating from the external device is partially dissipated to a heat-dissipating substrate through the insulating substrate.

However, both of the metal wire and lead member are connected to the land part, and thus, the area of the land part and consequently the insulating substrate are enlarged; therefore, there has been a problem of difficulty reducing the cost of the semiconductor device.

Accordingly, the present invention aims at providing a semiconductor device capable of efficiently dissipating heat propagating from an external device to inside the semiconductor device to a radiator, while reducing the cost of the semiconductor device.

Solution to Problem

A semiconductor device according to the present invention is a semiconductor device that is attached to a radiator and includes: a heat-generating electronic component having a first main electrode and a second main electrode; a sealing part that seals the heat-generating electronic component; a first lead member having a first inner lead part sealed with the sealing part and a first outer lead part exposed from the sealing part; and a second lead member having a second inner lead part that is electrically connected to the second main electrode and sealed with the sealing part, and a second outer lead part exposed from the sealing part, in which the first inner lead part has a heat-dissipating end part that releases heat propagating from the first outer lead part to the radiator, and an electrical connecting part that is positioned between the heat-dissipating end part and the first outer lead part and electrically connected to the first main electrode of the heat-generating electronic component.

Moreover, the semiconductor device may further include an insulating substrate that includes an insulating thermally conductive base material having a first main surface and a second main surface opposite the first main surface and a component-mounting land part formed on the first main surface, and the second inner lead part of the second lead member may be electrically connected to the component-mounting land part.

Moreover, in the semiconductor device, the insulating substrate may further include an isolated land part that is formed on the first main surface of the insulating thermally conductive base material and electrically isolated from the component-mounting land part, the heat-dissipating end part of the first inner lead part may be electrically connected to the isolated land part, and the first main electrode and the electrical connecting part of the first inner lead part may be electrically connected to each other by a metal wire without involving the isolated land part.

Alternatively, in the semiconductor device, the insulating substrate may further include an isolated land part that is formed on the first main surface of the insulating thermally conductive base material and electrically isolated from the component-mounting land part, the heat-dissipating end part of the first inner lead part may be electrically connected to the isolated land part, and the first main electrode and the electrical connecting part of the first inner lead part may be electrically connected to each other by a connector without involving the isolated land part.

Alternatively, in the semiconductor device, the insulating substrate may further include an isolated land part that is formed on the first main surface of the insulating thermally conductive base material and electrically isolated from the component-mounting land part, the heat-dissipating end part of the first inner lead part may be electrically connected to the isolated land part, and the first inner lead part may have an extended connection part that extends from the electrical connecting part and electrically connects to the first main electrode of the heat-generating electronic component.

Alternatively, in the semiconductor device, the heat-dissipating end part of the first inner lead part may include an exposed surface exposed from the sealing part.

Alternatively, in the semiconductor device, the insulating substrate may further include an exposed conductive part formed on the second main surface of the insulating thermally conductive base material, and the exposed conductive part may have an exposed surface that is exposed from the sealing part and makes contact with the radiator.

Moreover, in the semiconductor device, the heat-dissipating end part of the first inner lead part may include an exposed surface exposed from the sealing part, the second inner lead part may have a component-mounting part, and the heat-generating electronic component may be mounted on the component-mounting part such that the second main electrode is electrically connected to the component-mounting part.

Moreover, in the semiconductor device, the component-mounting part may have an exposed surface exposed from the sealing part, and an insulating sheet attached to the sealing part to cover the exposed surface of the heat-dissipating end part of the first inner lead part and the exposed surface of the component-mounting part may be further provided.

Alternatively, in the semiconductor device, the first main electrode and the first inner lead part may be electrically connected to each other by a metal wire.

Alternatively, in the semiconductor device, the first main electrode and the first inner lead part may be electrically connected to each other by a connector.

Alternatively, in the semiconductor device, the first inner lead part may have an extended connection part that extends from the electrical connecting part and electrically connected to the first main electrode of the heat-generating electronic component.

Moreover, in the semiconductor device, the heat-generating electronic component may be a semiconductor switching element further including a gate electrode.

Moreover, in the semiconductor device, the first main electrode and the gate electrode may be provided on an upper surface of the heat-generating electronic component, and the second main electrode may be provided on a lower surface of the heat-generating electronic component.

Alternatively, in the semiconductor device, one lead member of the first lead member and the second lead member may be electrically connected to a battery, and the other lead member may be electrically connected to a turn signal switch.

Advantageous Effects of Invention

In the present invention, the first inner lead part includes a heat-dissipating end part that releases heat propagating from the first outer lead part to the radiator, and an electrical connecting part that is positioned between the heat-dissipating end part and the first outer lead part and is electrically connected to the first main electrode of the heat-generating electronic component. Consequently, according to the present invention, it is possible to efficiently dissipate heat propagating from the external device to inside the semiconductor device to the radiator while reducing the cost of the semiconductor device.

DESCRIPTION OF EMBODIMENTS

Figure 1:
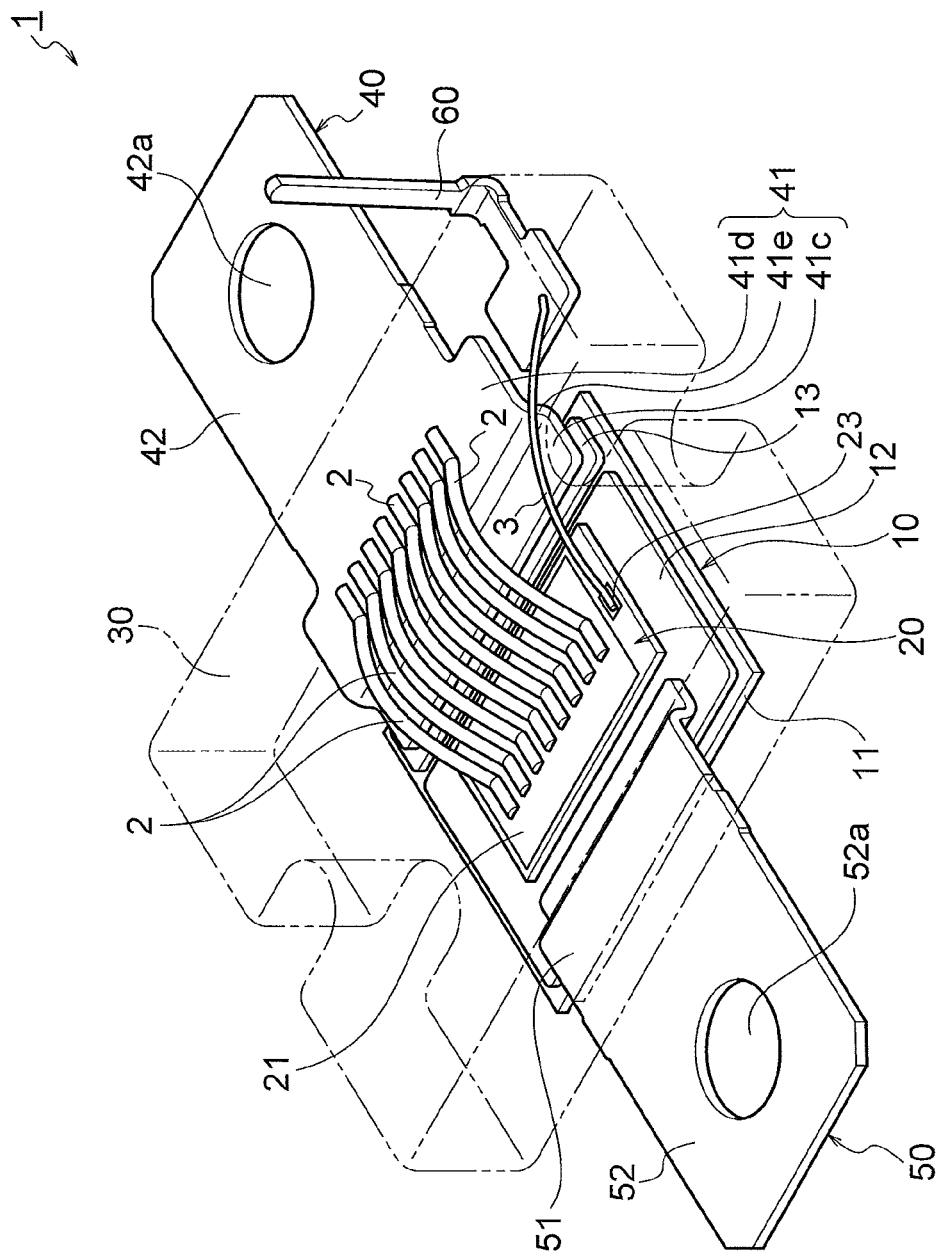
FIG. 1 is a transparent perspective view of a semiconductor device according to a first embodiment.

Hereinafter, a semiconductor device according to embodiments of the present invention will be described with reference to the drawings. Note that the same reference numeral is assigned to components having an equivalent function in each figure.

First Embodiment

A semiconductor device 1 according to a first embodiment is described with reference to FIG. 1 and FIG. 2.

The semiconductor device 1 is a semiconductor device which is attached to radiators (not shown) such as heat sinks and vehicle bodies. Although the semiconductor device 1 is a flasher relay in this embodiment, a semiconductor device according to the present invention is not limited thereto.

As illustrated in FIG. 1, the semiconductor device 1 includes an insulating substrate 10, a heat-generating electronic component 20, a sealing part 30, a lead member 40 (a first lead member), a lead member 50 (a second lead member), a lead member 60, and metal wires 2. The semiconductor device 1 is configured as a flasher relay, for example. When the semiconductor device 1 is a flasher relay, one lead member of the lead member 40 and the lead member 50 is electrically connected to a battery (not shown), whereas the other lead member is electrically connected to a turn signal switch (not shown).

Figure 2:
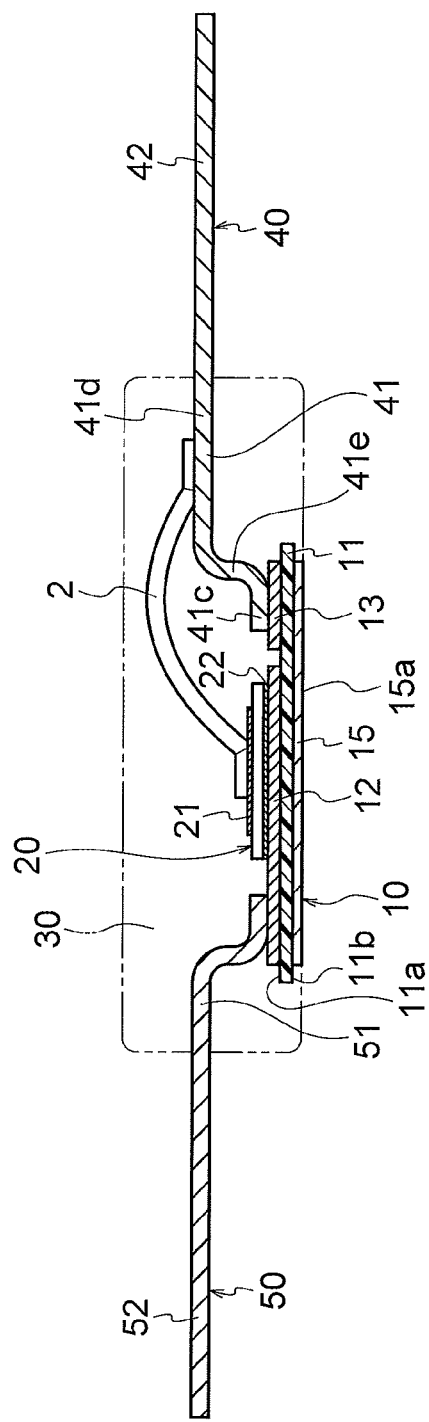
FIG. 2 is a sectional view of the semiconductor device according to the first embodiment.

As illustrated in FIG. 2, the insulating substrate 10 includes an insulating thermally conductive base material 11 having a main surface 11a (a first main surface) and a main surface 11b (a second main surface) opposite the first main surface, a component-mounting land part 12 formed on the main surface 11a, an isolated land part 13 formed on the main surface 11a, and an exposed conductive part 15 formed on the main surface 11b. The isolated land part 13 is an isolated land and electrically isolated from the component-mounting land part 12. The exposed conductive part 15 has an exposed surface 15a that is exposed from the sealing part 30 and makes contact with a radiator.

The insulating substrate 10 is a ceramic substrate in this embodiment but may be a different type of insulating substrate. The component-mounting land part 12, the isolated land part 13, and the exposed conductive part 15 are formed of a conductive material (copper in this embodiment).

The heat-generating electronic component 20 is a vertical structure device and, as illustrated in FIG. 1 and FIG. 2, a main electrode 21 (a first main electrode) and a gate electrode 23 are provided on its upper surface, and a main electrode 22 (a second main electrode) is provided on its lower surface. In this embodiment, the main electrode 21 is a drain electrode, and the main electrode 22 is a source electrode. Heat generated in the heat-generating electronic component 20 is dissipated to the radiator through the component-mounting land part 12, the insulating thermally conductive base material 11, and the exposed conductive part 15. The heat is partially dissipated into the air through the sealing part 30.

The heat-generating electronic component 20 is a semiconductor switching element. Examples of the semiconductor switching element include field effect transistors (Metal-Oxide-Semiconductor Field Effect Transistors: MOS FETs), insulated gate bipolar transistors (IGBTs), and thyristors.

Note that the heat-generating electronic component 20 may be a different type of electronic component such as a diode. In addition, the heat-generating electronic component 20 may be a lateral structure device in which the main electrodes 21, 22 and the gate electrode 23 are provided on its upper surface. In this case, the main electrode 22 and the component-mounting land part 12 are electrically connected by, for example, a metal wire or a connector.

The sealing part 30 is made of, for example, an insulating resin material and seals the insulating substrate 10, the heat-generating electronic component 20, inner lead parts 41, 51, and metal wires 2, 3. Note that the back surface of the insulating substrate 10 (the exposed conductive part 15) is not sealed by the sealing part 30.

The lead member 40 includes the inner lead part 41 (first inner lead part) sealed with the sealing part 30 and an outer lead part 42 (first outer lead part) exposed from the sealing part 30.

As illustrated in FIG. 1 and FIG. 2, the inner lead part 41 has a heat-dissipating end part 41c, a vertical extension part 41e, and an electrical connecting part 41d. The heat-dissipating end part 41c is provided at the tip of the inner lead part 41 and is configured to release heat propagating from the outer lead part 42 to the radiator. The electrical connecting part 41d is positioned between the heat-dissipating end part 41c and the outer lead part 42 and is electrically connected to the main electrode 21 of the heat-generating electronic component 20. This electrical connecting part 41d is a portion sandwiched between the vertical extension part 41e and the outer lead part 42. The vertical extension part 41e is provided to maintain a predetermined insulation distance between the outer lead part 42 and the radiator.

The heat-dissipating end part 41c of the inner lead part 41 is electrically connected to the isolated land part 13. In addition, as illustrated in FIG. 1 and FIG. 2, the main electrode 21 and the electrical connecting part 41d of the inner lead part 41 are electrically connected to each other by the metal wires 2 (e.g., Al wire), without involving the isolated land part 13. In this embodiment, a large current flows through the heat-generating electronic component 20, and thus, a plurality of the metal wires 2 is used. As illustrated in FIG. 2, one end of each metal wire 2 is electrically connected to the upper surface of the electrical connecting part 41d of the inner lead part 41.

Note that the outer lead part 42 is provided with a fixing hole 42a used in fixing the semiconductor device 1 to the radiator.

The lead member 50 is electrically connected to the main electrode 22 and includes the inner lead part 51 (second inner lead part) sealed with the sealing part 30 and an outer lead part 52 (second outer lead part) exposed from the sealing part 30. The inner lead part 51 is electrically connected to the component-mounting land part 12. Note that the outer lead part 52 is provided with a fixing hole 52a used in fixing the semiconductor device 1 to the radiator.

As illustrated in FIG. 1, the lead member 60 is electrically connected to the gate electrode 23 of the heat-generating electronic component 20 via the metal wire 3 (e.g., Au wire). The lead member 60 is connected to a driving device (not shown) that outputs a control signal for the heat-generating electronic component 20.

As is described above, in the first embodiment, the main electrode 21 of the heat-generating electronic component 20 and the electrical connecting part 41d of the inner lead part 41 are electrically connected to each other by the metal wires 2. That is, the main electrode 21 and the inner lead part 41 are electrically connected to each other without involving the isolated land part 13. Accordingly, the area of the isolated land part 13 can be reduced compared to when the metal wires 2 are connected to the isolated land part 13. As a result, the cost of the insulating substrate 10 can be reduced.

In addition, in the first embodiment, the heat-dissipating end part 41c of the inner lead part 41 is connected to the isolated land part 13 and is configured to release heat propagating from the outer lead part 42 to the radiator. Specifically, heat generated in the external device and propagating to inside the semiconductor device 1 through the outer lead part 42 is dissipated to the radiator through the heat-dissipating end part 41c of the inner lead part 41, the isolated land part 13, the insulating thermally conductive base material 11, and the exposed conductive part 15. Accordingly, it is possible to efficiently dissipate the heat propagating from the external device to inside the semiconductor device 1 to the radiator. Consequently, according to the first embodiment, it is possible to efficiently dissipate the heat propagating from the external device to inside the semiconductor device 1 to the radiator while reducing the cost of the semiconductor device 1.

<Method for Producing the Semiconductor Device 1>

A method for producing the above-mentioned semiconductor device 1 is described with reference to FIG. 3A to FIG. 3F.

Figure 3A:
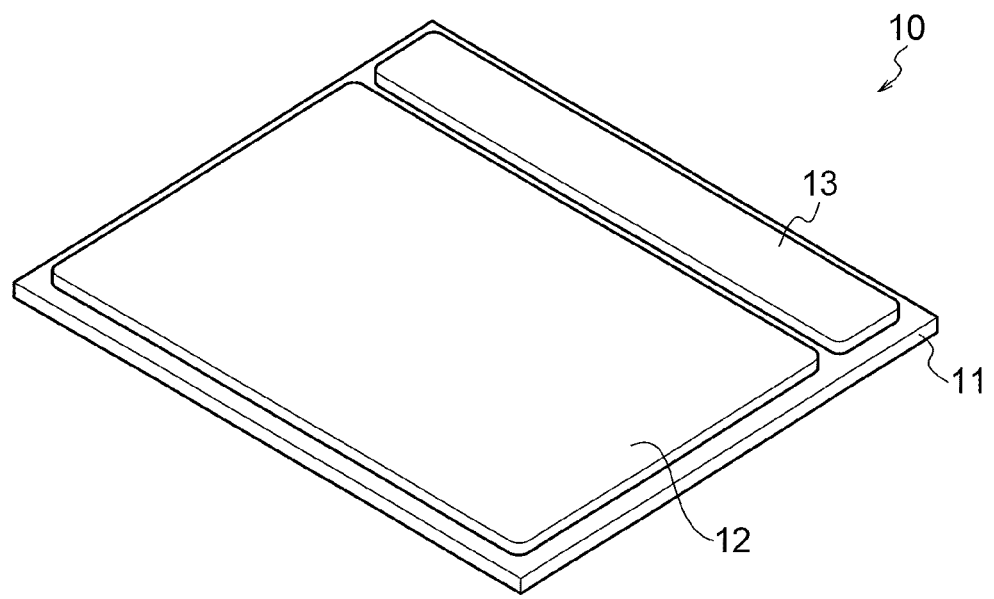
FIG. 3A is a perspective view for explaining a method for producing the semiconductor device according to the first embodiment.

First, as illustrated in FIG. 3A, the insulating substrate 10 is prepared. As is described above, the component-mounting land part 12 and the isolated land part 13 are provided on the upper surface of the insulating thermally conductive base material 11. After the preparation, a solder paste (not shown) is applied on a predetermined portion of the component-mounting land part 12 and the isolated land part 13.

Figure 3B:
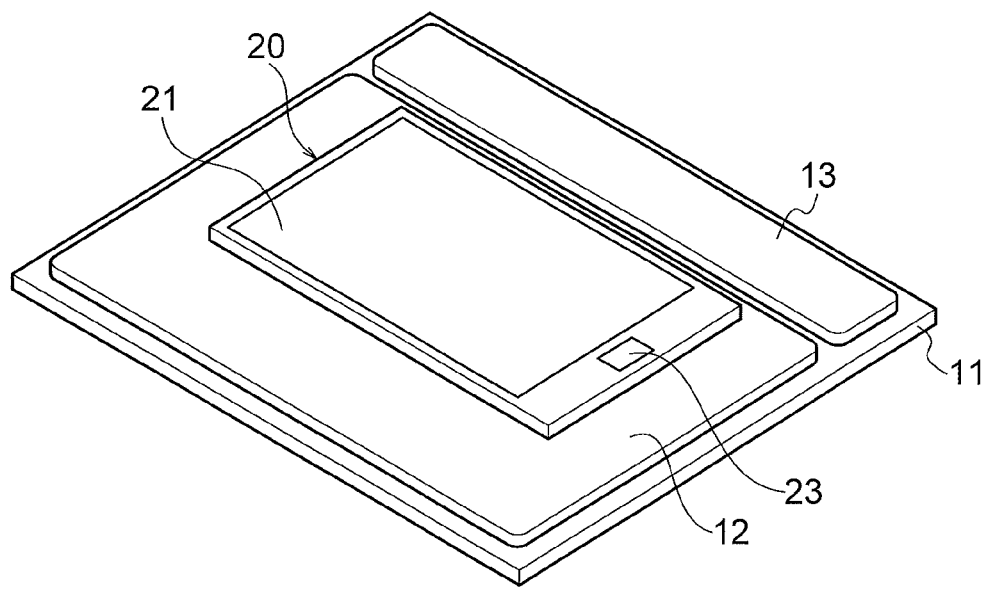
FIG. 3B is a perspective view for explaining the method for producing the semiconductor device according to the first embodiment, following FIG. 3A.

Next, as illustrated in FIG. 3B, the heat-generating electronic component 20 is mounted on the component-mounting land part 12 of the insulating substrate 10. More specifically, the heat-generating electronic component 20 is mounted on the component-mounting land part 12 such that the main electrode 22 provided on the lower surface of the heat-generating electronic component 20 is electrically connected to the component-mounting land part 12 via the solder paste.

Figure 3C:
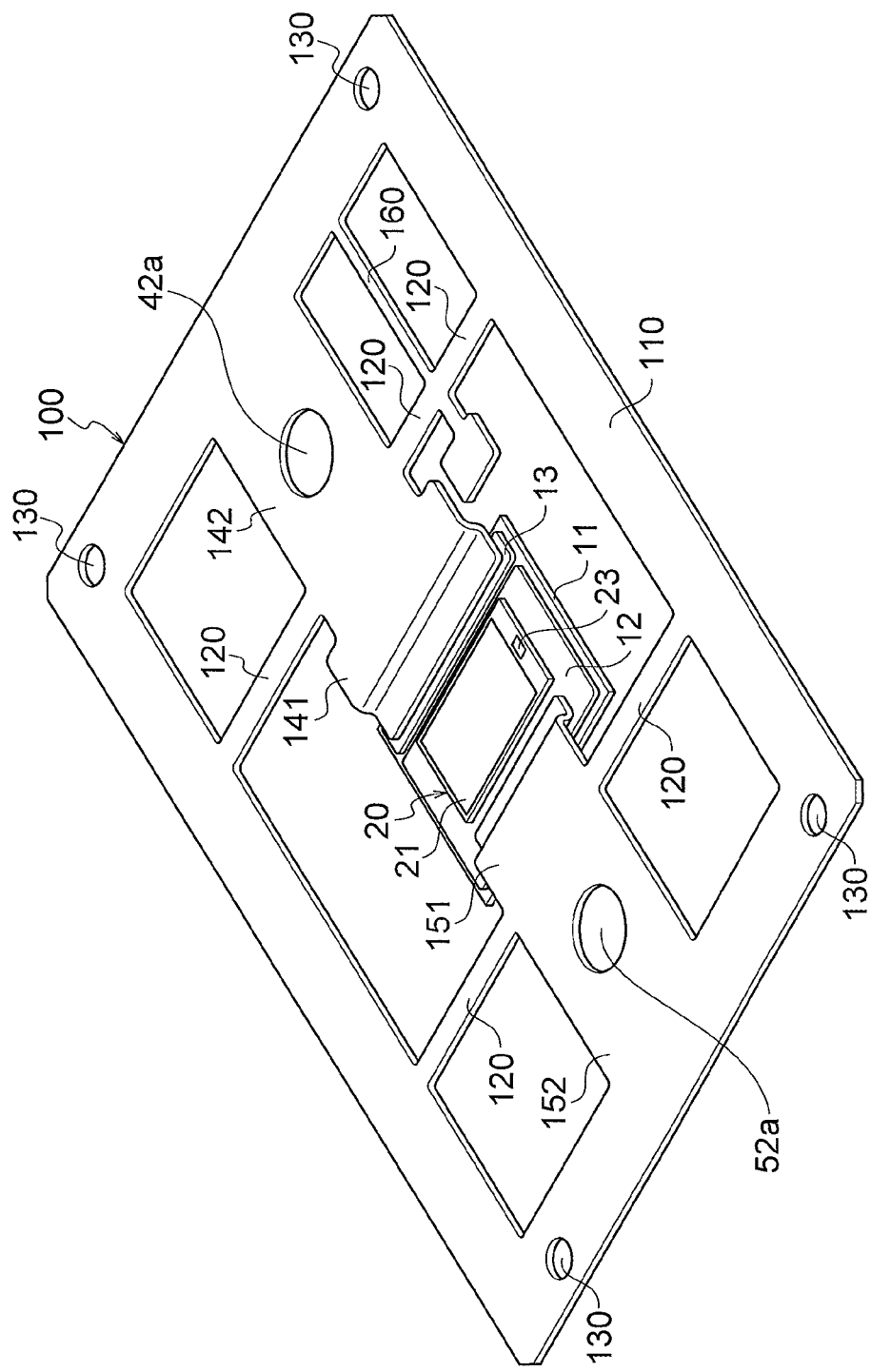
FIG. 3C is a perspective view for explaining the method for producing the semiconductor device according to the first embodiment, following FIG. 3B.

Then, as illustrated in FIG. 3C, a lead frame 100 is prepared. This lead frame 100 includes a frame part 110, a plurality of tie bars 120, positioning holes 130 provided at the four corners of the frame part 110, lead frame terminals 141, 142, 151, 152, and a lead frame gate terminal 160. The lead frame terminals 141 and 151 are parts which become the inner lead parts 41 and 51, respectively, and the lead frame terminals 142 and 152 are parts which become the outer lead parts 42 and 52, respectively. The lead frame gate terminal 160 is a part which becomes the lead member 60. The lead frame terminals 142 and 152 are respectively provided with the fixing holes 42a and 52a used in fixing the semiconductor device 1 to the radiator.

Subsequently, after the lead frame 100 is prepared, as illustrated in FIG. 3C, a relative position between the insulating substrate 10 and the lead frame 100 are adjusted, and the lead frame 100 is mounted on the insulating substrate 10. More specifically, the relative position is adjusted such that the tip portion of the lead frame terminal 141 is positioned on the isolated land part 13, and the tip portion of the lead frame terminal 151 is positioned on the component-mounting land part 12. Thereafter, through a reflow process, the heat-generating electronic component 20 is fixed to the insulating substrate 10, and the lead frame 100 is fixed to the insulating substrate 10.

Figure 3D:
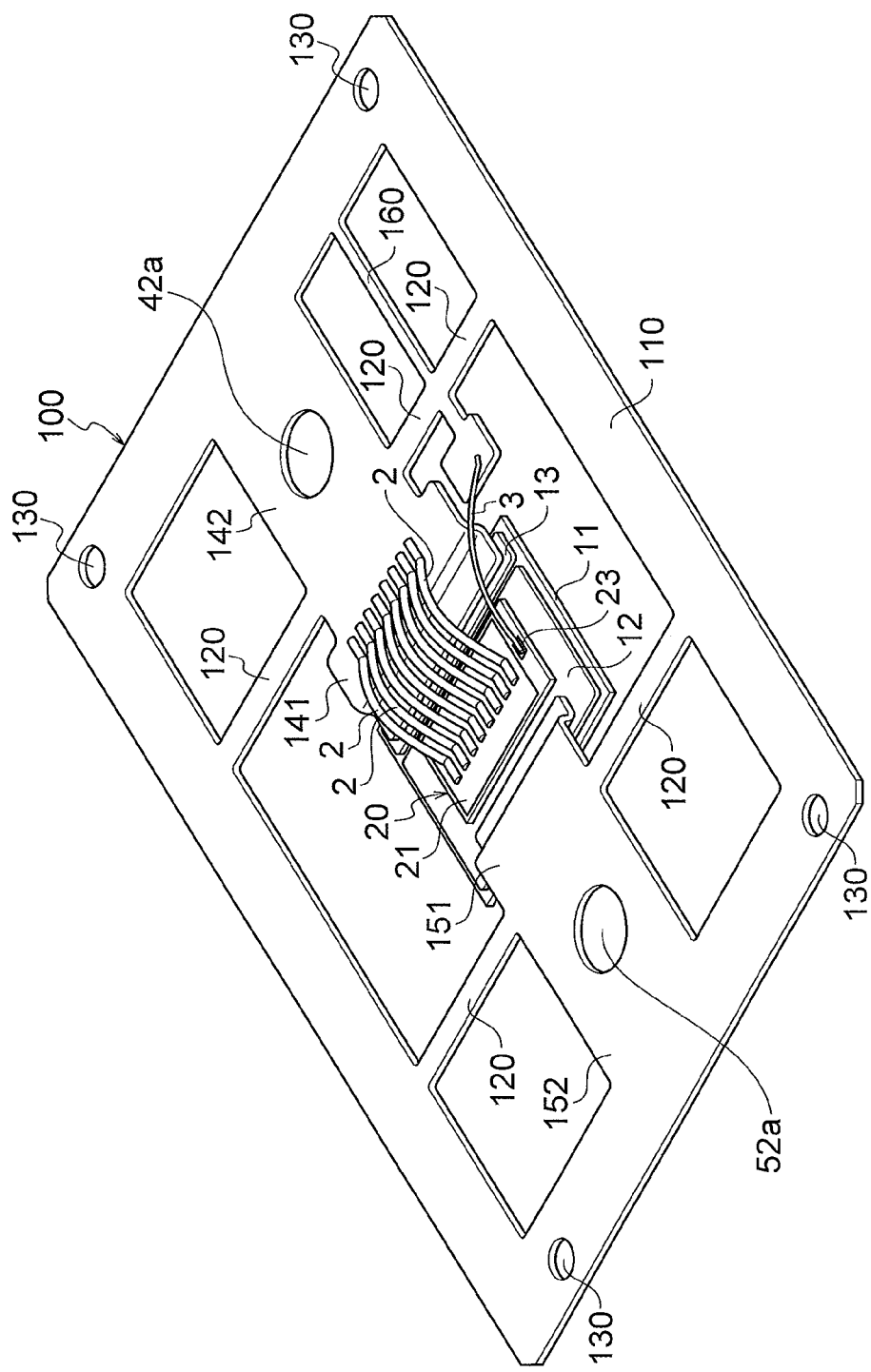
FIG. 3D is a perspective view for explaining the method for producing the semiconductor device according to the first embodiment, following FIG. 3C.

After that, a wire bonding process is performed. In this process, as illustrated in FIG. 3D, the multiple metal wires 2 electrically connect between the main electrode 21 of the heat-generating electronic component 20 and the lead frame terminal 141. In addition, the metal wire 3 electrically connects between the gate electrode 23 of the heat-generating electronic component 20 and the lead frame gate terminal 160. In this embodiment, the metal wires 2 are Al wires, and the metal wire 3 is an Au wire. The metal wires 2 and 3 are joined to the respective objects by ultrasonic vibration.

Figure 3E:
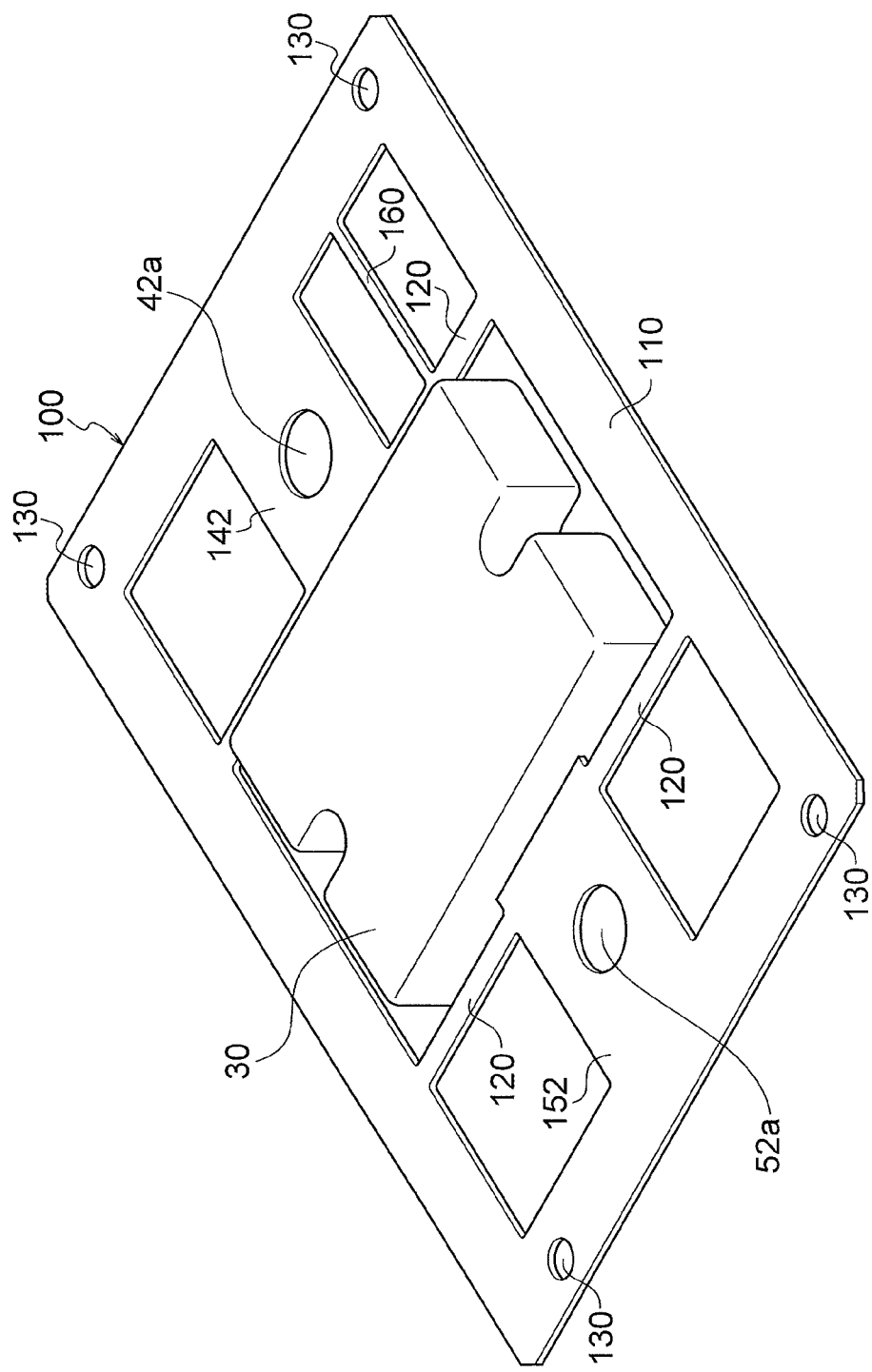
FIG. 3E is a perspective view for explaining the method for producing the semiconductor device according to the first embodiment, following FIG. 3D.

Then, as illustrated in FIG. 3E, the sealing part 30 is formed by sealing the insulating substrate 10, the heat-generating electronic component 20, the lead frame terminals 141, 151, and the metal wires 2, 3 by transfer molding. Note that the back surface of the insulating substrate 10 is not sealed with resin, and the exposed conductive part 15 is exposed.

Figure 3F:
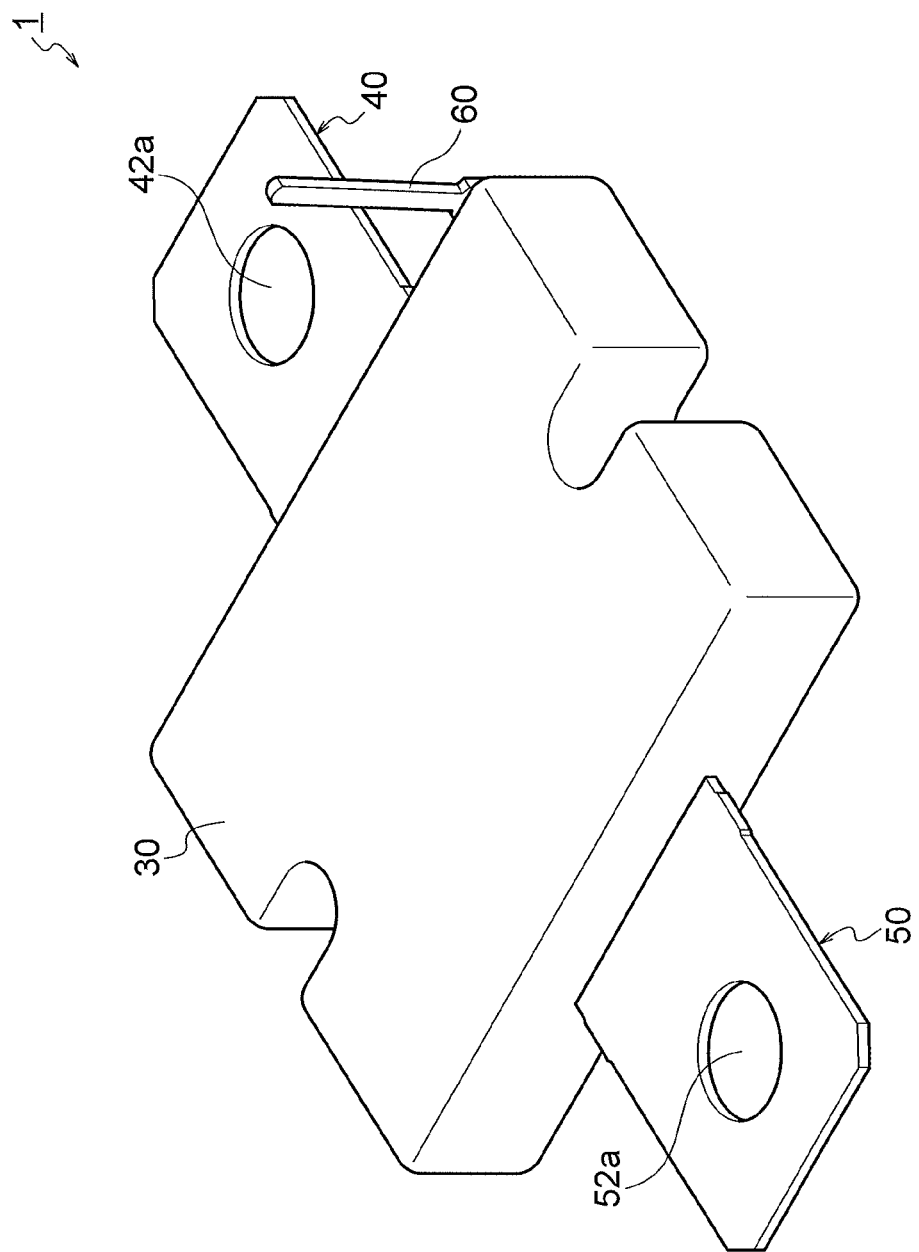
FIG. 3F is a perspective view for explaining the method for producing the semiconductor device according to the first embodiment, following FIG. 3E.

Finally, as illustrated in FIG. 3F, the semiconductor device 1 is obtained by cutting off the frame part 110 and the tie bars 120.

Second Embodiment

A semiconductor device 1 according to a second embodiment is described with reference to FIG. 4. In the second embodiment, a connector 70 is used instead of the metal wires 2. In the following, the second embodiment is described, focusing on the differences from the first embodiment.

Figure 4:
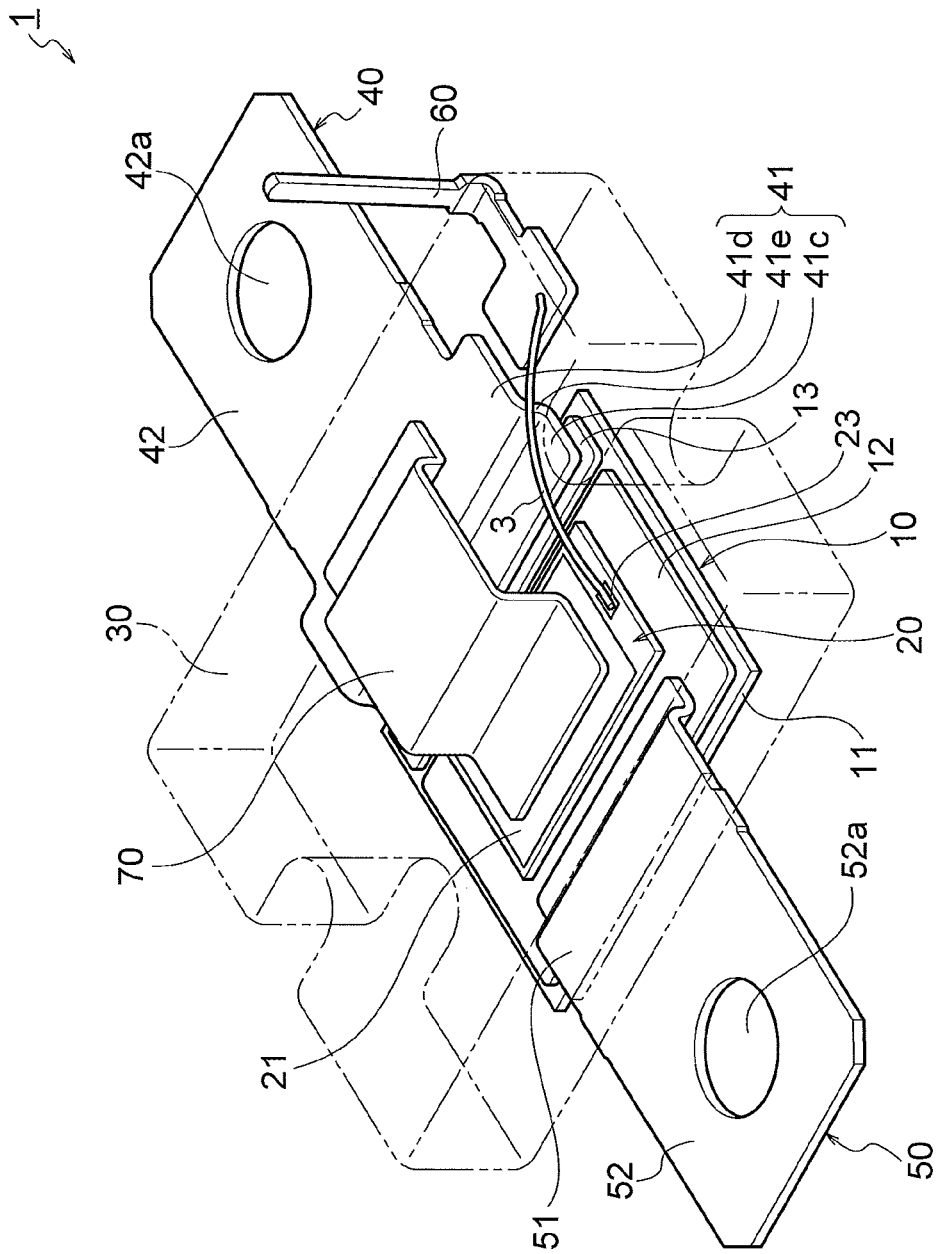
FIG. 4 is a transparent perspective view of a semiconductor device according to a second embodiment.

As illustrated in FIG. 4, the semiconductor device 1 according to the second embodiment includes the insulating substrate 10, the heat-generating electronic component 20, the sealing part 30, the lead member 40, the lead member 50, the lead member 60, and the connector 70. The components other than the connector 70 are the same as in the first embodiment, and thus, the detailed explanation is omitted.

The connector 70 is a conductive plate material and electrically connects between the main electrode 21 of the heat-generating electronic component 20 and the electrical connecting part 41d of the inner lead part 41. More specifically, one end of the connector 70 is connected to the main electrode 21 via a solder, and the other end of the connector 70 is connected to the electrical connecting part 41d of the inner lead part 41 via a solder.

As is described above, in the second embodiment, the main electrode 21 of the heat-generating electronic component 20 and the electrical connecting part 41d of the inner lead part 41 are electrically connected by the connector 70. That is, the main electrode 21 and the inner lead part 41 are electrically connected to each other without involving the isolated land part 13. Further, the heat-dissipating end part 41c of the inner lead part 41 is connected to the isolated land part 13.

Consequently, as with the first embodiment, according to the second embodiment, it is possible to efficiently dissipate heat propagating from an external device to inside the semiconductor device 1 to a radiator while reducing the cost of the semiconductor device 1.

In addition, in the second embodiment, the connector 70 is used instead of the multiple metal wires 2, and thus, the wire bonding process for the metal wires 2 is dispensed with. In the case of this embodiment, after adjusting the relative position between the insulating substrate 10 and the lead frame 100 (see FIG. 3C), the connector 70 is mounted on the main electrode 21 and the inner lead part 41 via a solder paste and fixed thereto in the subsequent reflow process. As is described above, according to the second embodiment, the wire bonding process for the metal wires 2 is dispensed with, and thus, the production method of the semiconductor device can be simplified, and consequently the cost of the semiconductor device 1 can be further reduced.

Third Embodiment

A semiconductor device 1 according to a third embodiment is described with reference to FIG. 5. In the third embodiment, the lead member 40M, but not the metal wires 2, is directly connected to the main electrode 21. In the following, the third embodiment is described, focusing on the differences from the first embodiment.

Figure 5:
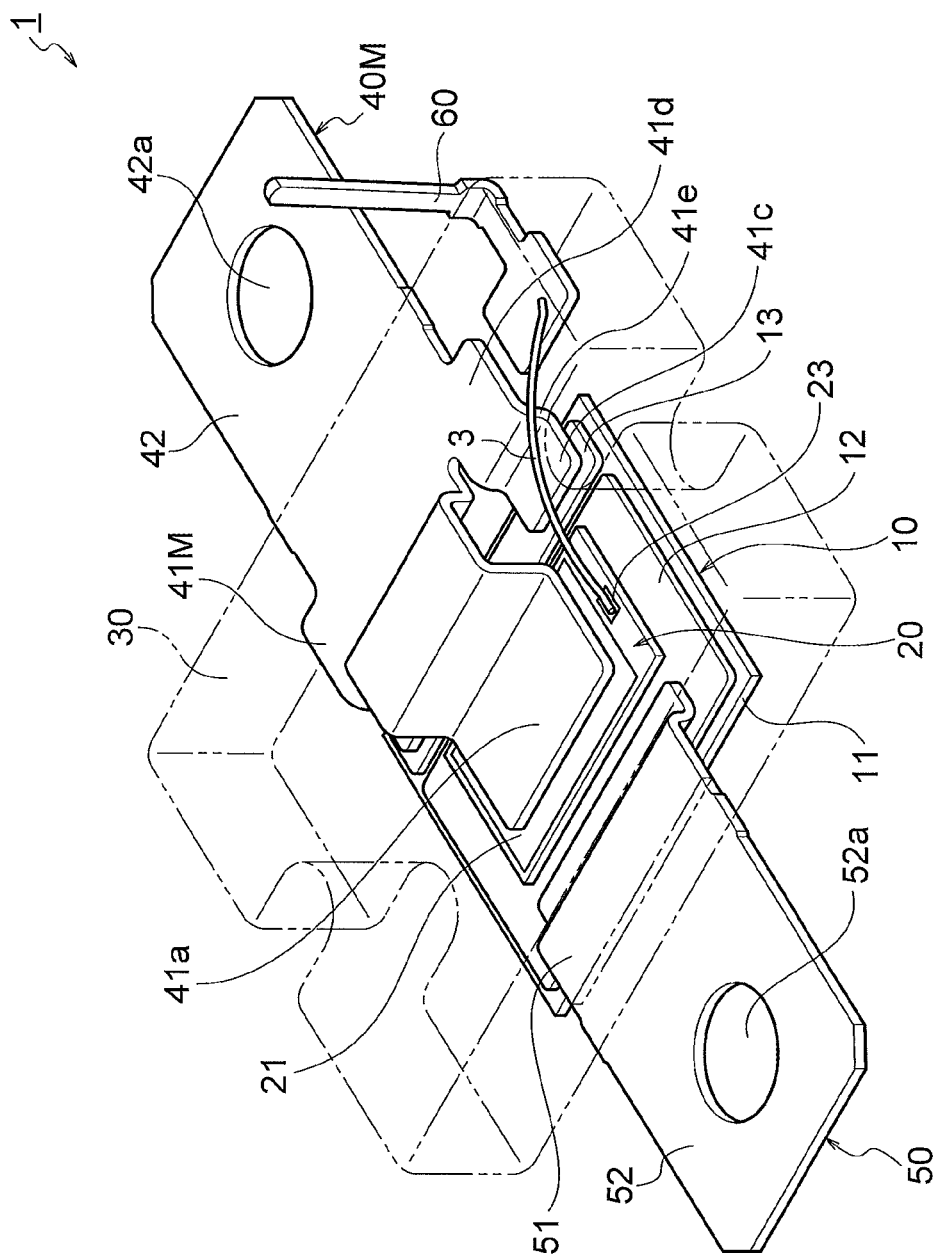
FIG. 5 is a transparent perspective view of a semiconductor device according to a third embodiment.

As illustrated in FIG. 5, the semiconductor device 1 according to the third embodiment includes the insulating substrate 10, the heat-generating electronic component 20, the sealing part 30, the lead member 40M, the lead member 50, and the lead member 60. The components other than the lead member 40M are the same as in the first embodiment, and thus, the detailed explanation is omitted.

The lead member 40M has an inner lead part 41M sealed with the sealing part 30 and the outer lead part 42 exposed from the sealing part 30. As illustrated in FIG. 5, the inner lead part 41M further includes an extended connection part 41a in addition to the heat-dissipating end part 41c and the electrical connecting part 41d. The extended connection part 41a is extended from the electrical connecting part 41d and is electrically connected to the main electrode 21 of the heat-generating electronic component 20. In this embodiment, the inner lead part 41M is bent such that both end portions at its tip comes into contact with the isolated land part 13. Note that the configuration of the inner lead part 41M is not limited thereto.

As is described above, in the third embodiment, the extended connection part 41a of the inner lead part 41M is electrically connected to the main electrode 21 of the heat-generating electronic component 20 and is configured to release heat propagating from the outer lead part 42 to a radiator through the heat-dissipating end part 41c of the inner lead part 41. That is, the heat generated in the external device and propagating to inside the semiconductor device 1 through the outer lead part 42 is dissipated to the radiator through the heat-dissipating end part 41c, the isolated land part 13, the insulating thermally conductive base material 11, and the exposed conductive part 15. Consequently, as with the first embodiment, according to the third embodiment, it is possible to efficiently dissipate the heat propagating from the external device to inside the semiconductor device 1 to the radiator while reducing the cost of the semiconductor device 1.

In addition, in the third embodiment, the metal wires 2 and the connector 70 are not used and the inner lead part 41M is configured to be connected to both the main electrode 21 and the isolated land part 13, and thus, the production method of the semiconductor device can be simplified. Consequently, according to the third embodiment, the cost of the semiconductor device 1 can be further reduced.

Fourth Embodiment

A semiconductor device 1 according to a fourth embodiment is described with reference to FIG. 6. In the fourth embodiment, an inner lead part is directly connected to a radiator without involving an insulating substrate. In the following, the fourth embodiment is described, focusing on the differences from the first embodiment.

Figure 6:
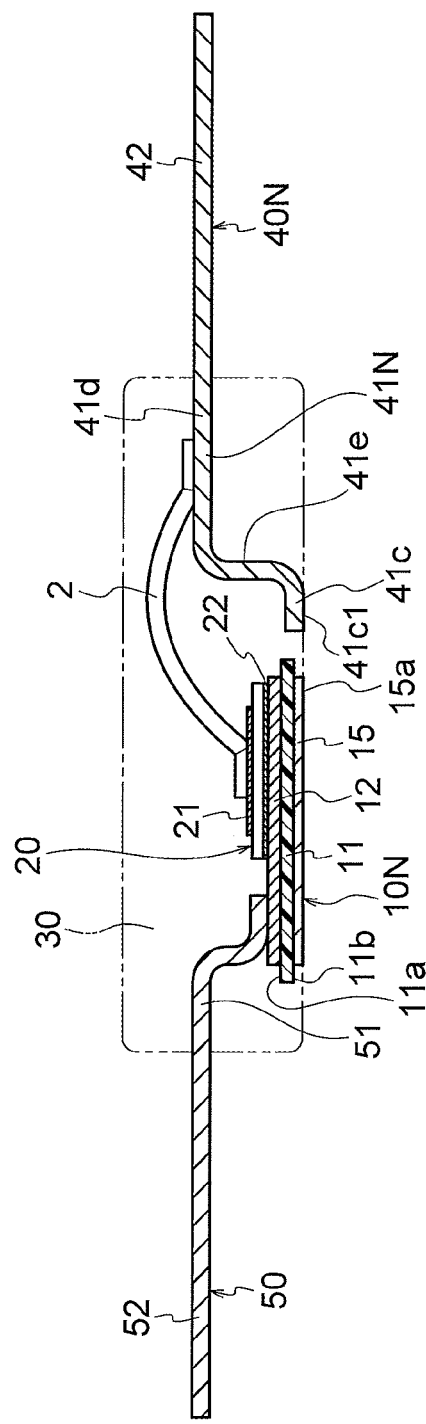
FIG. 6 is a sectional view of the semiconductor device according to a fourth embodiment

As illustrated in FIG. 6, the semiconductor device 1 according to the fourth embodiment includes an insulating substrate 10N, the heat-generating electronic component 20, the sealing part 30, a lead member 40N, the lead member 50, and the lead member 60. The components other than the insulating substrate 10N and the lead member 40N are the same as in the first embodiment, and thus, the detailed explanation is omitted.

The insulating substrate 10N includes the insulating thermally conductive base material 11 having the main surface 11a and the main surface 11b, and the component-mounting land part 12 formed on the main surface 11a. The isolated land part 13 is not provided, and thus, the area of the insulating substrate 10N is small compared to that of the insulating substrate 10 of the first to third embodiments.

The lead member 40N includes the inner lead part 41N sealed with the sealing part 30 and the outer lead part 42 exposed from the sealing part 30. The heat-dissipating end part 41c of the inner lead part 41N has an exposed surface (lower surface in FIG. 6) 41c1. This exposed surface 41c1 is exposed from the sealing part 30 and makes contact with a radiator in a state where the semiconductor device 1 is attached to the radiator.

As illustrated in FIG. 6, the main electrode 21 and the inner lead part 41N are electrically connected to each other by the metal wire 2. That is, one end of the metal wire 2 is electrically connected to the main electrode 21 of the heat-generating electronic component 20, and the other end of the metal wire 2 is electrically connected to the inner lead part 41N. More specifically, the other end of the metal wire 2 is electrically connected to the electrical connecting part 41d sandwiched between the vertical extension part 41e and the outer lead part 42 in the inner lead part 41N.

As is described above, in the fourth embodiment, the inner lead part 41N is electrically connected to the main electrode 21 of the heat-generating electronic component 20 without an intervening land part on the insulating thermally conductive base material 11 and is configured to release heat propagating from the outer lead part 42 through the heat-dissipating end part 41c directly connected to a radiator. That is, the heat generated in the external device and propagating to inside the semiconductor device 1 through the outer lead part 42 is dissipated to the radiator through the heat-dissipating end part 41c of the inner lead part 41N without involving the insulating substrate 10N. In this embodiment, it is possible to dissipate the heat propagating to inside the semiconductor device 1 to the radiator more efficiently as an insulating substrate is not involved. As is described above, according to the fourth embodiment, it is possible to efficiently dissipate the heat propagating from the external device to inside the semiconductor device 1 to the radiator while reducing the cost of the semiconductor device 1.

In addition, in the fourth embodiment, the area of an insulating substrate can be reduced as an isolated land part is not provided, and thus, the cost of the insulating substrate can be reduced. Consequently, according to the fourth embodiment, the cost of the semiconductor device 1 can be further reduced.

Note that although the main electrode 21 and the inner lead part 41N are connected by the metal wire 2 in this embodiment, the present invention is not limited thereto, and a connector may be used to connect them as in the second embodiment, or alternatively, the inner lead part 41N may be directly connected to the main electrode 21 as in the third embodiment.

Fifth Embodiment

A semiconductor device 1 according to a fifth embodiment is described with reference to FIG. 7 and FIG. 8. In the fifth embodiment, an insulating substrate is not used, and a heat-generating electronic component is mounted on an inner lead part. In the following, the fifth embodiment is described, focusing on the differences from the first embodiment.

Figure 7:
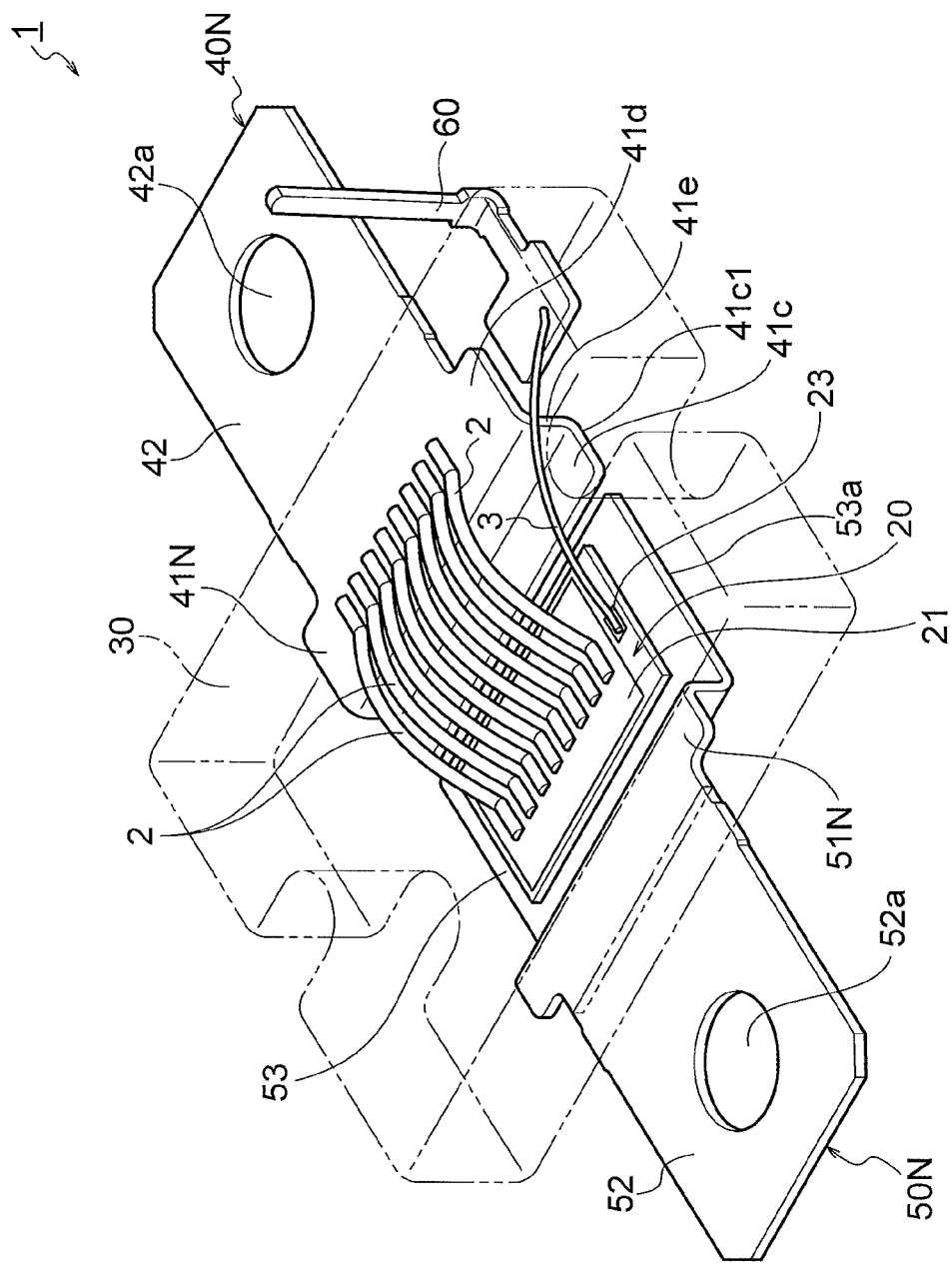
FIG. 7 is a transparent perspective view of a semiconductor device according to a fifth embodiment.
Figure 8:
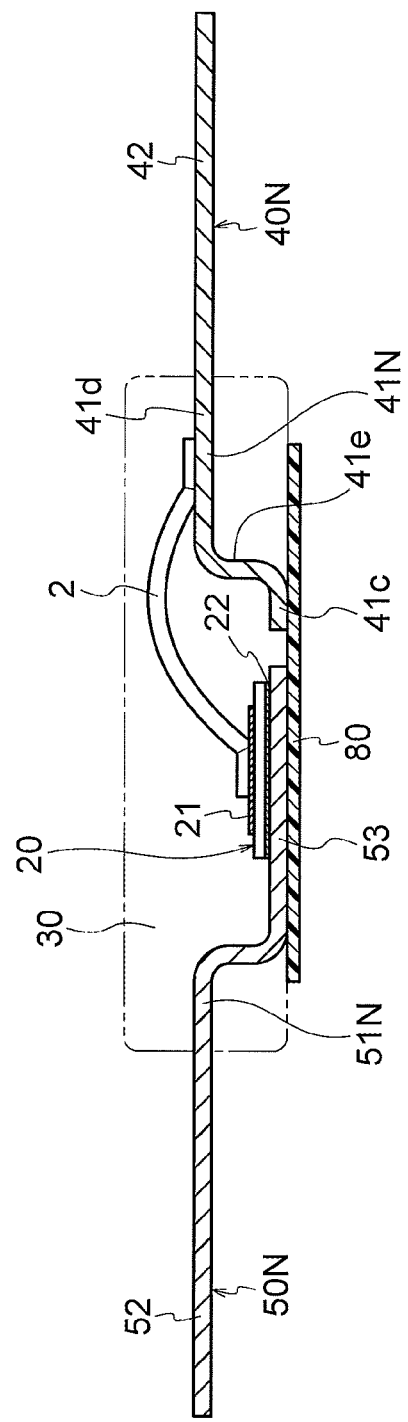
FIG. 8 is a sectional view of the semiconductor device according to the fifth embodiment.

As illustrated in FIG. 7 and FIG. 8, the semiconductor device 1 according to the fifth embodiment includes the heat-generating electronic component 20, the sealing part 30, the lead member 40N, a lead member 50N, the lead member 60, and an insulating sheet 80. The heat-generating electronic component 20, the sealing part 30, and the lead member 60 are the same as in the first embodiment, and the lead member 40N is the same as in the fourth embodiment, and thus, the detailed explanation about these components is omitted.

The lead member 50N includes an inner lead part 51N sealed with the sealing part 30 and the outer lead part 52 exposed from the sealing part 30. The inner lead part 51N has a component-mounting part (die pad) 53 as illustrated in FIG. 7 and FIG. 8. This component-mounting part 53 has an exposed surface 53a exposed from the sealing part 30. The exposed surface 53a comes into contact with a radiator in a state where the semiconductor device 1 is attached to the radiator.

The heat-generating electronic component 20 is mounted on the component-mounting part 53. More specifically, the heat-generating electronic component 20 is mounted on the component-mounting part 53 such that the main electrode 22 is electrically connected to the component-mounting part 53 via a solder. Note that when the heat-generating electronic component 20 is a lateral structure device, the main electrode 22 and the component-mounting part 53 are electrically connected to each other via a metal wire, a connector, or the like.

The insulating sheet 80 is formed of an insulating material (e.g., polyimide or PET) and is attached to the sealing part 30 to cover the exposed surface 41c1 of the heat-dissipating end part 41c and the exposed surface 53a of the component-mounting part 53. This insulating sheet 80 prevents a short-circuit between the heat-dissipating end part 41c and the component-mounting part 53 in a state where the semiconductor device 1 is attached to the conductive radiator. Note that the insulating sheet 80 is not an essential component of the semiconductor device of this embodiment and may be provided on the part of the radiator.

As is described above, according to the fifth embodiment, the inner lead part 41N is electrically connected to the main electrode 21 of the heat-generating electronic component 20 without an intervening land part on an insulating substrate and is configured to release heat propagating from the outer lead part 42 to a radiator through the heat-dissipating end part 41c. That is, heat generated in the external device and propagating to inside the semiconductor device 1 through the outer lead part 42 is dissipated to the radiator through the heat-dissipating end part 41c. In this embodiment, it is possible to dissipate the heat propagating to inside the semiconductor device 1 to the radiator more efficiently as an insulating substrate is not involved. As is described above, according to the fifth embodiment, it is possible to efficiently dissipate the heat propagating from the external device to inside the semiconductor device 1 to the radiator while reducing the cost of the semiconductor device 1.

In addition, according to the fifth embodiment, the insulating substrate 10 is not used, and thus, component cost and production cost of the semiconductor device 1 can be significantly reduced.

Note that although the main electrode 21 and the inner lead part 41N are connected by the metal wire 2 in this embodiment, the present invention is not limited thereto, and a connector may be used to connect them as in the second embodiment, or alternatively, the inner lead part 41N may be directly connected to the main electrode 21 as in the third embodiment. Moreover, although the component-mounting part 53 is exposed from the sealing part 30 in this embodiment, the present invention is not limited thereto, and the component-mounting part 53 may be buried inside the sealing part 30.

Although those skilled in the art may conceive of additional effects or various modifications of the present invention on the basis of the above-mentioned description, aspects of the present invention are not limited to above-mentioned individual embodiments. Components over different embodiments may be arbitrarily combined. It is possible to make various additions, changes and partial deletion without departing from the conceptual idea and scope of the present invention derived from the content defined in the claims and the equivalent thereof.

REFERENCE SIGNS LIST

1 semiconductor device
2, 3 metal wire
10, 10N insulating substrate
11 insulating thermally conductive base material
11a, 11b main surface
12 component-mounting land part
13 isolated land part
15 exposed conductive part
20 heat-generating electronic component
21, 22 main electrode
23 gate electrode
30 sealing part
40, 40M, 40N, 50, 50N, 60 lead member
41, 41M, 41N, 51, 51N inner lead part
41a extended connection part
41c heat-dissipating end part
41d electrical connecting part
41e vertical extension part
42, 52 outer lead part
42a, 52a fixing hole
41c1, 53a exposed surface
53 component-mounting part
70 connector
80 insulating sheet
100 lead frame
110 frame part
120 tie bar
130 positioning hole
141, 142, 151, 152 lead frame terminal
160 lead frame gate terminal

The invention claimed is:

1. A semiconductor device comprising:
an insulating substrate;
a first conductor layer formed on the insulating substrate;
a second conductor layer formed on the insulating substrate;
an electronic element provided on the first conductor layer;
a first lead member connected to the second conductor layer;
a second lead member connected to the first conductor layer; and
a sealing part that seals the first conductor layer, the second conductor layer and the electronic element, wherein
the first lead member has an inner lead part arranged inside the sealing part and an outer lead part arranged outside the sealing part,
the inner lead part has a base part that is connected to the outer lead part, a first extension part that extends from the base part toward the second conductor layer and is connected to the second conductor layer, and a second extension part that extends from the base part toward the electronic element and is connected to the electronic element without directly connecting to the second conductor layer, the base part, the first extension part and the second extension part are formed integrally, and
the first lead member is configured to release heat propagating from the outer lead part to an outside of the sealing part through the first extension part, the second conductor layer and the insulating substrate.

2. A semiconductor device comprising:
an electronic element having a first electrode and a second electrode;
a first lead member electrically connected to the first electrode;
a second lead member electrically connected to the second electrode;
a connecting member that electrically connects the first electrode and the first lead member; and
a sealing part that seals the electronic element and the connecting member, wherein
the first lead member has an inner lead part arranged inside the sealing part and an outer lead part arranged outside the sealing part,
the inner lead part has a base part that is connected to the outer lead part, and an extension part that extends from the base part toward an end face of the sealing part,
an end part of the extension part is exposed to an outside of the sealing part,
the base part and the extension part are formed integrally,
the first lead member is configured to release heat propagating from the outer lead part to an outside of the sealing part through the extension part, and
the connecting member is arranged across the base part of the inner lead part and the first electrode of the electronic element.

3. The semiconductor device according to claim 1, further comprising a third conductor layer formed on a surface of the insulating substrate, the surface being opposite to a surface on which the first and second conductor layer are formed, and the third conductor layer being exposed to an outside of the sealing part.

4. The semiconductor device according to claim 1, wherein the inner lead part has two of the first extension part on a first side and a second side of the second extension part.

5. The semiconductor device according to claim 1, wherein the first extension part extends from the base part in a first direction orthogonal to a second direction along which the base part extends, and a tip side part of the first extension part extends along the second direction.

6. The semiconductor device according to claim 2, wherein the extension part extends from the base part in a first direction orthogonal to a second direction along which the base part extends, and a tip side part of the extension part extends along the second direction.

\* \* \* \* \*